United States Patent
Iwasawa et al.

(10) Patent No.: US 7,375,354 B2
(45) Date of Patent: May 20, 2008

(54) ION IMPLANTING METHOD AND APPARATUS

(75) Inventors: Koji Iwasawa, Kyoto (JP); Nobuo Nagai, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 990 days.

(21) Appl. No.: 10/800,892

(22) Filed: Mar. 15, 2004

(65) Prior Publication Data
US 2004/0232350 A1  Nov. 25, 2004

Related U.S. Application Data

(62) Division of application No. 10/280,057, filed on Oct. 25, 2002, now Pat. No. 6,750,462.

(30) Foreign Application Priority Data
Oct. 26, 2001  (JP)  ............... P. 2001-328662

(51) Int. Cl.
*H01J 37/00*  (2006.01)
(52) U.S. Cl. .................. 250/492.21; 250/492.3
(58) Field of Classification Search ........... 250/492.21, 250/492.3
See application file for complete search history.

(56) References Cited

U.S. PATENT DOCUMENTS

| | | | |
|---|---|---|---|
| 4,929,840 A | | 5/1990 | Dykstra et al. |
| 5,393,984 A | * | 2/1995 | Glavish ............... 250/396 ML |
| 5,811,823 A | * | 9/1998 | Blake et al. ............ 250/492.21 |
| 6,075,249 A | * | 6/2000 | Olson ...................... 250/396 R |
| 6,525,327 B1 | * | 2/2003 | Mitchell et al. ........ 250/492.21 |
| 6,635,880 B1 | * | 10/2003 | Renau .................. 250/396 ML |
| 6,677,599 B2 | * | 1/2004 | Berrian ..................... 250/492.3 |
| 6,696,688 B2 | * | 2/2004 | White et al. ......... 250/396 ML |
| 6,710,359 B2 | * | 3/2004 | Olson et al. ........... 250/492.21 |
| 6,750,462 B2 | * | 6/2004 | Iwasawa et al. ......... 250/492.3 |
| 6,777,695 B2 | * | 8/2004 | Viviani .................. 250/492.21 |
| 6,833,552 B2 | * | 12/2004 | Berrian ..................... 250/492.3 |
| 6,870,170 B1 | * | 3/2005 | Farley et al. .......... 250/492.21 |
| 7,064,491 B2 | * | 6/2006 | Horsky et al. .......... 315/111.81 |

FOREIGN PATENT DOCUMENTS

| | | |
|---|---|---|
| JP | 3-74040 | 3/1991 |
| JP | 4-22900 | 1/1992 |
| JP | 2000-150407 | 5/2000 |
| JP | 2001-143651 | 5/2001 |
| JP | 2001-185071 | 7/2001 |
| KR | 9610052 | 7/1996 |

* cited by examiner

*Primary Examiner*—David Vanore
(74) *Attorney, Agent, or Firm*—Finnegan, Henderson, Farabow, Garrett & Dunner, L.L.P.

(57) ABSTRACT

The ion implanting method uses both reciprocatively scanning an ion beam in an X direction and reciprocatively mechanically driving a substrate in a Y direction orthogonal thereto. An implanting step of implanting ions separately for two implanted regions with different dose amounts of the substrate is executed plural times by changing at the center of the substrate a driving speed of the substrate. A rotating step of rotating the substrate around its center by a prescribed angle is executed once during each of the intervals between the respective implanting steps and while the ion beam is not applied to the substrate.

1 Claim, 8 Drawing Sheets

IMPLANTING

ROTATING

IMPLANTING

ION IMPLANTING METHOD AND APPARATUS

This is a division of application Ser. No. 10/280,057, filed Oct. 25, 2002, now U.S. Pat. No. 6,750,462 which claims the right to priority based on Japanese Application No. 2001-328662, filed Oct. 26, 2001, and is incorporated herein by reference.

BACKGROUND OF THE INVENTION

1. Field of the Invention

An invention relates to an ion implanting method and apparatus for forming implanted regions with different dozes on a surface of a substrate.

2. Description of the Related Art

In recent years, there is a demand of forming implanted regions with different dose amounts on a surface of a single substrate. This is because forming such implanted regions is efficient to reduce a number of necessary substrates and steps in e.g. adjustment of an ion implanting apparatus and manufacturing semiconductor devices with different characteristics.

An example of a technique of ion-implantation to meet the above demand is described in JP-A-2000-15407.

As seen from FIGS. 12A-C, in a conventional ion implanting method by using a raster scan system of scanning an ion beam 4 in two vertical and horizontal directions (i.e. two-dimensionally), a scanning direction of the ion beam 4 is inverted around a center of a single substrate 2, and then an ion implantation is performed for each of ¼ regions with different dose amounts on a surface of the substrate 2. The dose amounts changes in accordance with a scanning speed of the ion beam 4. Thus, four implanted regions with different dose amounts are formed on the surface of the substrate 2.

In the above conventional ion implantation technique, the scanning direction of the ion beam 4 is inverted at the center of the substrate 2. Before and after this inversion, the ion beam 4 passes processes of "deceleration"→"stopping"→"acceleration to an opposite direction" so that the scanning speed of the ion beam 4 decreases at the center of the substrate 2. Owing to this, as seen from FIG. 13, an excessively implanted region 6 is generated linearly at the center of the substrate 2.

Assuming that a diameter of the ion beam 4 in a spot shape is $d_0$, a width $W_1$ of the excessively implanted region 6 become certainly larger than $d_0$.

If the above problem is solved by some methods, a transient region 8 is generated in the above conventional ion implanting method as shown in FIG. 14. The transient region is a region that dose amounts at boundaries between the implanted regions continuously changes (Hereinafter, referred to "a transient region").

This is because the ion beam 4 has a limited size. Assuming that the diameter of the ion beam is $d_0$, the width $W_1$ of the transient region 8 becomes $d_0$.

Meanwhile, an available area which can be actually used to manufacture semiconductor devices in an entire surface of the substrate 2 is only an other area than region 8. Therefore, in order to increase the available area, the diameter $d_0$ of the ion beam 4 must be decreased. However, when the diameter $d_0$, is decreased, a sectional area of the ion beam 4 is decreases. As a result, a beam current of the ion beam 4 is greatly decreased. It is not practical to take a long time to process the substrate 2.

The above conventional ion implanting method adopts the raster scan system in which the ion beam 4 is scanned two-dimensionally (vertically and horizontally). However, a main trend of the present (probably so in the future) ion implanting method (apparatus) is a hybrid scan system as disclosed in e.g. JP-A-2001-143651 and JP-A-2001-185071, in which the entire surface of the substrate is subjected to ion implantation using both the electromagnetic scanning of the ion beam and mechanical driving of the substrate. The above conventional technique cannot be applied as it is to this hybrid scan system.

Even if the concept of the above conventional ion implanting method could be applied to the hybrid scan system, both the scanning of the ion beam and a driving of the substrate must be carried out in a different manner from an ordinary hybrid scan system.

Both the devices for scanning the ion beam and for driving the substrate must be modified so that the scanning direction of the ion beam can be instantaneously changed while it is scanned and also the substrate can be driven or stopped with short steps and instantaneously in synchronism with the change of the direction of the ion beam. This makes the necessary control and mechanism complicate, and leads to high cost.

Therefore, the above modification cannot be easily realized.

SUMMARY OF THE INVENTION

It is an object of the invention to provide an ion implanting method and apparatus for forming a plurality of implanted regions with different dose amounts on a surface of a substrate.

The ion implanting method and apparatus do not make any excessively implanted region. Further, it can decrease a width of a transient region of dose amounts without decreasing a beam current. Further more, it can be easily controlled. The transient region is a region that dose amounts at boundaries between the implanted regions continuously changes (Herein after, referred to "a transient region").

In order to achieve the above objective, an ion implanting method of the present invention comprising:

implanting ions while one of a scanning steed of an ion beam and a driving speed of the substrate changes at a center of the substrate in order to separate for two implanted regions on the substrate with different dose amounts; and rotating the substrate around its center by a predetermined angle after implanting ions while the ion beam is not applied to the substrate.

In the second aspect of the invention, the ion implanting method further comprising:

repeating by the implanting and rotation steps.

In the third of the invention, the method for implanting ions on a surface of a substrate according to claim 1, wherein implanting ions is performed by reciprocatively scanning an ion beam in an X direction by an electric field or a magnetic field and by reciprocatively and mechanically driving the substrate in a Y direction, which is substantially orthogonal to the X direction.

In the forth aspect of the invention, an apparatus for implanting ions on a surface of a substrate, the apparatus comprising:

a scanning device for reciprocatively scanning an ion beam in an X direction by an electric field or a magnetic field;

a driving device for reciprocatively and mechanically driving the substrate in a Y direction, which is substantially orthogonal to the X direction;

a rotating device for rotating the substrate around a center of the substrate;

a control device for controlling the rotating device and one of the scanning device and the driving device;

wherein the control device changes one of a scanning speed of the ion beam and a driving speed of the substrate so that ion implantation is performed to separate for two implanted regions on the substrate with different dose amounts, the control device controls the rotating device to rotate the substrate around its center by a predetermined angle after the ion implantation while the ion beam is not applied to the substrate, and the control device control to repeat the ion implantation and the rotation.

In accordance with these aspects of the inventions, since the ion implantation is implemented separately for the two implanted regions of the substrate with different dose amounts by the implanting step once performed, in combination with the rotating step, the plurality of implanted regions with different dose amounts can be formed within the surface of the substrate.

More specifically, assuming that the number of times of the implanting step is $n_1$ ($n_1$ is an integer of 2 or more), the number of times of the rotating step is $n_1-1$. By executing these implanting step and rotating step, $2n_1$ implanted regions with different dose amounts can be formed within the surface of the single substrate.

In addition, in these inventions, one of the scanning speed of the ion beam and the driving speed of the substrate is changed at the center of the substrate, but unlike the conventional technique, the scanning direction of the ion beam is not inverted within the surface of the substrate and the substrate is not driven and stopped with short steps while the ion beam is applied to the substrate. Namely, the ion beam does not stand still on the substrate 2 so that no excessively implanted region is formed within the surface of the substrate.

Further, when the above speed is changed, the transient region of the dose is produced within the surface of the substrate. However, the direction of changing the speed is one-dimensional (i.e. either one dimension of the X direction of scanning the ion beam and the Y direction of driving the substrate) unlike two-dimensional in the conventional technique. For this reason, by reducing the size of the ion beam in the pertinent one dimension (X direction or Y direction), the width of the transient region can be decreased. However, the size of the ion beam in the other remaining dimension is not required to be reduced, rather may be increased. Thus, reduction in the area of the ion beam can be suppressed to prevent the beam current from decreasing.

Further, the direction of changing the speed is one-dimensional as described above. In addition, the speed has only to be changed and unlike the conventional technique, the instantaneous change of the direction of the ion beam and instantaneous driving/stopping of the substrate are not required. Further, rotating the substrate as described above can be implemented itself by a known simple technique. Thus, in the case of the hybrid scan system also, the above control can be easily made and the mechanism therefor does not become complicated.

In the forth aspect of the invention, the method for implanting ions on a surface of a substrate according to claim 1, wherein implanting ions is performed by reciprocatively scanning an ion beam in an X direction and a Y direction orthogonal thereto by an electric field or magnetic field.

In the fifth aspect of the invention, an apparatus for implanting ions on a surface of a substrate, the apparatus comprising:

a scanning device for reciprocatively scanning an ion beam in an X direction and a Y direction orthogonal thereto by an electric field or a magnetic field;

a rotating device for rotating the substrate around a center of the substrate;

a control device for controlling one of the scanning device and the rotating device;

wherein the control device changes one of a scanning speed of the ion beam in the X direction and a scanning speed of the ion beam in the Y direction so that ion implantation is performed in order to separate for two implanted regions on the substrate with different dose amounts, the control device controls the rotating device to rotate the substrate around its center by a predetermined angle after the ion implantation while the ion beam is not applied to the substrate, and the control device control to repeat the ion implantation and the rotation.

These inventions also provide substantially the same effects as the inventions as described above.

In accordance with these inventions, since the ion implantation is implemented separately for the two implanted regions of the substrate with different dose amounts by the implanting step once performed, in combination with the rotating step, the plurality of implanted regions with different dose amounts can be formed within the surface of the substrate.

In addition, in these inventions, the scanning speed of the ion beam is only changed at the center of the substrate, but unlike the conventional technique, the scanning direction of the ion beam is not inverted within the surface of the substrate. Namely, the ion beam does not stand still on the substrate 2 so that no excessively implanted region is formed within the surface of the substrate.

Further, the direction of changing the scanning speed of the ion beam is one-dimension, i.e. X direction or Y direction. For this reason, by reducing the size of the ion beam in the pertinent one dimension, the width of the transient region can be decreased while reduction in the beam current is prevented.

Since the direction of changing the scanning speed of the ion beam is one-dimension as described above, and also the scanning speed is only changed, the control can be easily made. The rotation of the substrate as described above can be implemented itself by the known simple technique. Thus, the above control can be easily made and the mechanism will not be complicated.

DETAILED DESCRIPTION OF THE PREFERRED EMBODIMENTS

Figure 1:
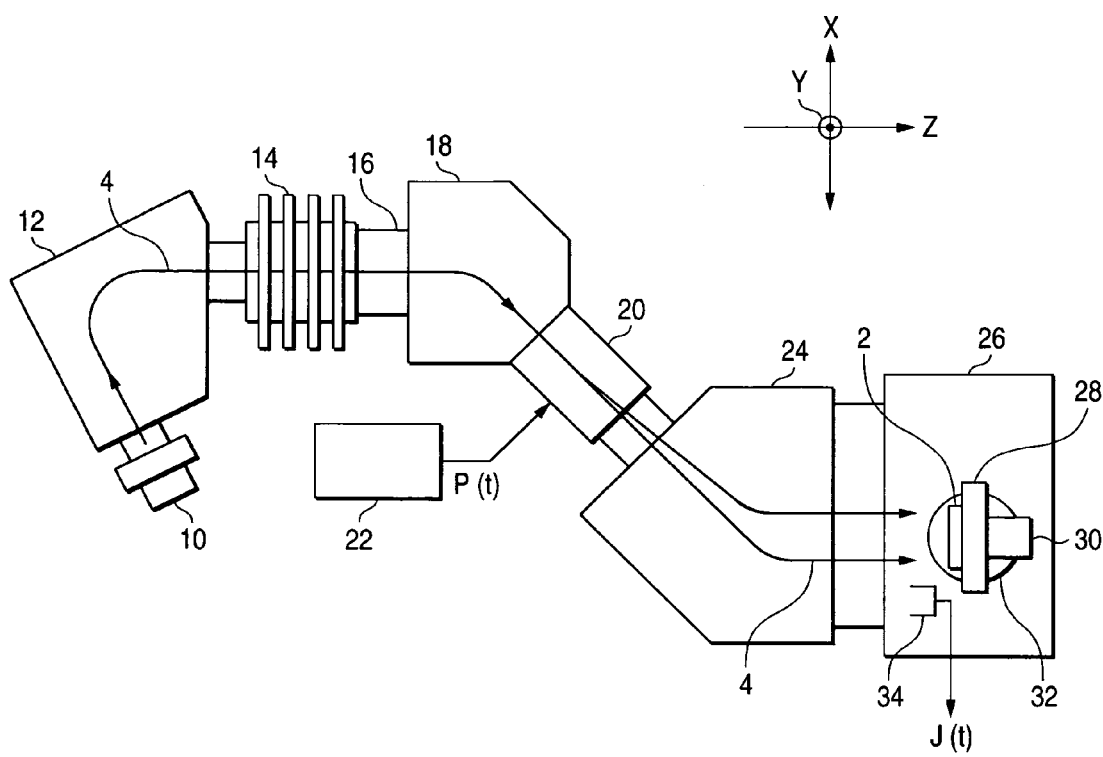
FIG. 1 is a schematic plan view showing an example of the ion implantation apparatus for implementing the ion implantation method according to this invention.
Figure 2:
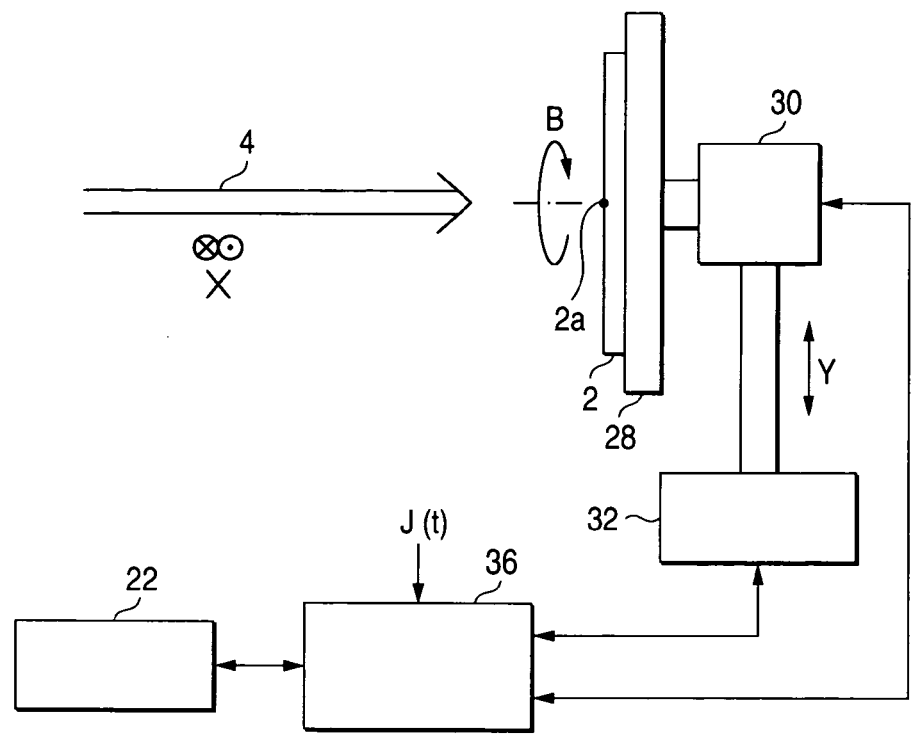
FIG. 2 is an enlarged schematic side view showing an example of the mechanism in the vicinity of the substrate in the ion implantation apparatus shown in FIG. 1.

FIG. 1 is a schematic plan view showing an example of an ion implanting apparatus for implementing the ion implantation method according to this invention. FIG. 2 is an enlarged schematic side view showing an example of a mechanism in a vicinity of a substrate in the ion implanting apparatus shown in FIG. 1.

This ion implantation apparatus adopts a hybrid scan system.

In the ion implantation apparatus, an ion beam 4 is reciprocatively scanned in an X direction (e.g. horizontal direction) by an electric field or magnetic filed. A substrate (e.g. semiconductor device) is also reciprocatively mechanically driven in a Y direction (e.g. vertical direction), which is substantially orthogonal to the X direction. Thus, ions are implanted on an entire surface of the substrate 2 by cooperation.

More specifically, the ion implanting apparatus includes an ion source 10 for extracting an ion beam 4, a mass separating magnet 12 for selectively deriving a specific ion species from the ion beam 4 extracted from the ion source 10, an accelerating tube 14 for accelerating or decelerating the ion beam 4 derived from the mass separating magnet 12, a Q lens 16 for shaping the ion beam 4 derived from the accelerating tube 14, an energy separating magnet 18 for selectively deriving the ions with a specific energy from the ion beam 4 derived from the C lens 16, a scanning magnet 20 for reciprocatively scanning the ion beam 4 derived from the energy separating magnet 18 in the X direction by a magnetic field in this embodiment, and a paralleling magnet 24 for bending the ion beam 4 derived from the scanning magnet 20 again to conduct the parallel scanning of the ion beam 4 in corporation with the scanning magnet 20.

The ion beam 4 derived from the paralleling magnet 24 is applied to the substrate 2 held in a holder 28 within an implanting chamber 26 so that the ions are implanted into the substrate 2. In this case, the substrate 2 is reciprocatively driven in the Y direction by a driving device 32. The cooperation between the reciprocative driving of the substrate 2 and the reciprocative scanning of the ion beam 4 permits the entire surface of the substrate 2 to be ion-implanted.

In such an ion implantation apparatus in the hybrid scan system, ion implantation with a uniform dose amount is carried out for the entire surface of the substrate 2. This can be realized by controlling the ion implantation so that the uniform ion implantation is carried out in both X and Y directions of the substrate 2. This technique will be briefly explained below.

As regards the X direction, a density of the ion beam 4 can be regarded substantially constant in the scanning direction of X. This is reasonable in such an ion implantation apparatus. Therefore, by scanning the ion beam 4 in the X direction at a constant speed, the uniform implantation can be realized for the X direction.

The following control is made for the Y direction a dose amount D at a certain point of the surface of the substrate 2 is proportional to a value obtained by integrating a beam current density J (t) of the ion beam 4 applied to a point with respect to an applying time T as represented by a following Equation.

A term (t) represents that the equation is a function of a time t (This applies to the equations described herein below). C denotes a proportional constant.

$$D = C \int_0^T J(t)dt \qquad \text{Equation 1}$$

Assuming that a driving speed in the Y direction of the substrate 2 is v (t), and a distance thereof in the Y direction is H, v (t) can be expressed by a following equation (dH denotes a distance driven by a minute time dt).

$$v(t) = dH/dt \qquad \text{Equation 2}$$

Therefore, Equation 1 can be expressed as follows.

$$D = C \int_0^H \{J(t)/v(t)\}dH$$

Namely, if v (t) is controlled so that the J (t)/v (t) is constant even when the beam current density J (t) is varied, the dose amount D at, the issued point can be maintained at a target value.

This control is made over an entire region in the Y direction of the substrate 2. Thus, a uniform implantation can be realized in the Y direction without being affected by a variation in the beam current density J (t).

In the apparatus according to this embodiment, the beam current density J (t) of the ion beam 4 applied to the substrate 2 is given to a control device 36. The beam current density J (t) is indirectly measured by a Faraday cup 34. Using the beam current density J (t), the control device 36 controls the driving device 32 to control the driving speed as described above.

The above description relates to the method of ion implantation implemented with the uniform dose amount for the entire surface of the substrate. The above-described method is well-know as shown in JP-A-4-22900 or JP-A-3-74040.

Next, an explanation will be given of the method and apparatus for forming a plurality of regions with different dose amounts on the surface of the single substrate according to this invention.

In order to perform the ion implantation for this purpose, in this example, a rotating device 30 is provided to rotate the substrate 2 as well as the holder 28 around a center 2a of the substrate (in the direction of arrow B in FIG. 2). The driving device 32 serves to drive the entirety of the rotating device 30, holder 28 and substrate 2 reciprocatively in the Y direction. In this example, the rotation of the rotating device 30 is controlled by the control device 36.

For the purpose of dividing the implanted region into plural areas, there are cases where a driving speed in the Y direction of the substrate 2 is changed and the scanning speed in the X direction of the ion beam 4 is changed. Now, an example of the former will be first explained and an example of the latter will be explained later.

Figure 3:
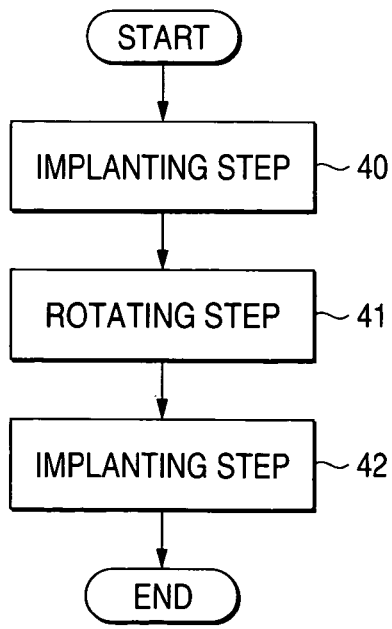
FIG. 3 is a flowchart showing an embodiment of the ion implanting method according to this invention.

FIGS. 3 and 4 shows an example of ion implanting method according to this invention.

First, a driving speed in the Y direction of the substrate 2 is changed at the center 2a of the substrate 2 so that the driving speed when the ion beam 4 is applied to the upper half of the substrate 2 is $v_A$.

The driving speed when the ion beam 4 is applied to the lower half thereof is $v_B$ ($\neq v_A$).

Figure 4A:
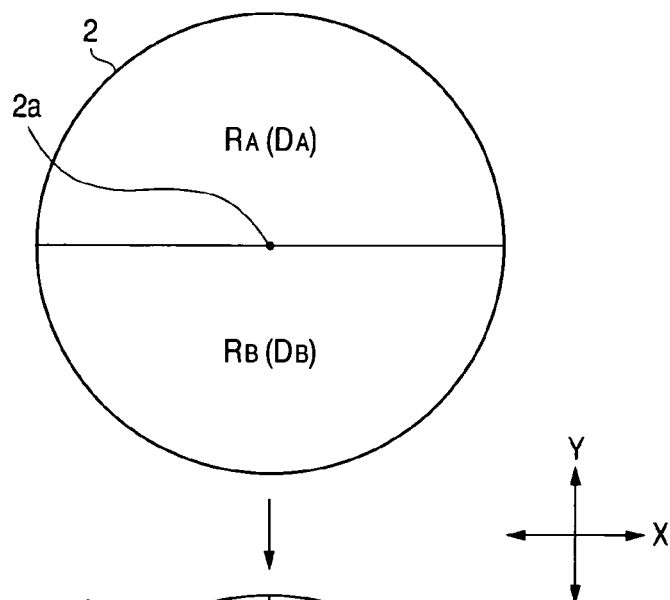
FIG. 4 is a flowchart showing the ion implanting method shown in FIG. 3 using a substrate.

In this way, as seen from FIG. 4A an implanting step 40 is executed to form two ion-implanted regions $R_A$ and $R_B$ (with different dose amounts $D_A$ and $D_B$, respectively) into which the substrate 2 is divided.

Incidentally, in this specification, the "upper" and "lower" means those in the Y direction.

To change the driving speed in the Y direction of the substrate 2 at the center 2a of the substrate 2 means that the driving speed in the Y direction of the substrate 2 is changed when the substrate 2 has come to a position where the ion beam 4 is applied to the center 2a of the substrate 2.

Whether or not the substrate 2 has come to such a position can be easily known by the control device 36 by a control command to the driving device 32 or feedback information from the driving device 32.

A dose amount for each of the above driving speeds is concretely represented by Equation 3. The driving speed of the substrate 2 is controlled to make J (t)/v (t) constant before and after the driving speed in the Y direction of the substrate 2 is changed when the substrate 2 has come to a position where the ion beam 4 is applied to the center 2a of the substrate 2. This also applies to the other implanting steps described below.

Next, a rotating step 41 is executed in which the substrate 2 is rotated at the center 2a thereof by a prescribed angle θ in the direction of arrow B (counterclockwise) while the ion beam 4 is not being applied to the substrate 2 (for example, the substrate 2 remains above or below the ion beam 4.

Figure 4B:
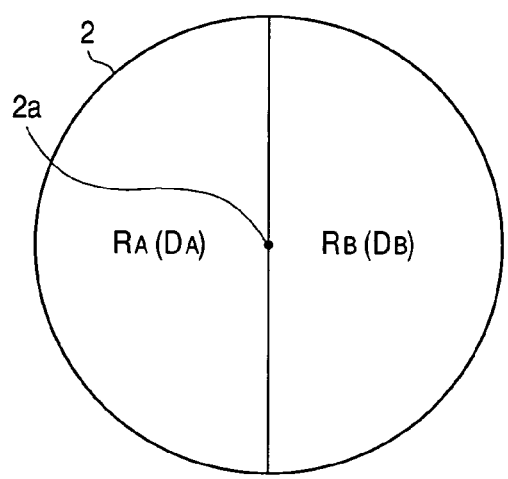

A result is shown in FIG. 4B in case that the rotating angle θ is 90 degree.

And then, the driving speed in the Y direction of the substrate 2 is changed at the center 2a of the substrate 2. In this example, the driving speed when the ion beam 4 is applied to an upper half of the substrate 2 is $V_C$ and that for a lower half thereof is $V_D$ ($\neq V_C$).

Figure 4C:
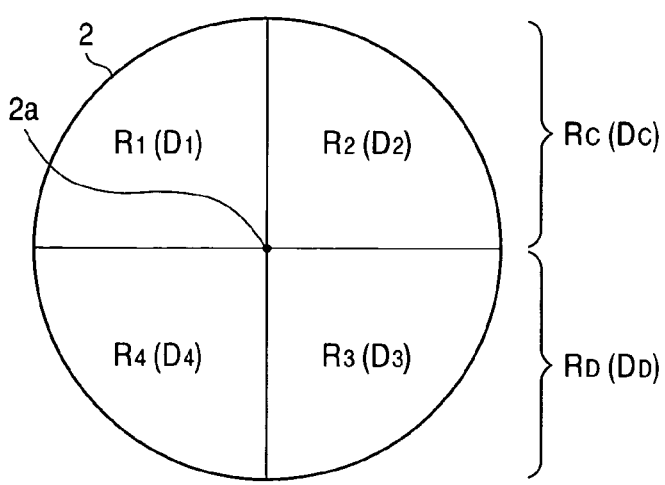

In this way, as seen from FIG. 4C, an implanting step 42 is executed to form two implanted regions $R_C$ and $R_D$ (with different dose amounts $D_C$ and $D_D$, respectively) into which the substrate 2 is divided.

Thus, the implantation results by the above two implanting steps 40 and 42 overlap on the surface of the substrate 2. As a result, as shown in FIG. 4C, four implanted regions $R_1$-$R_4$ are formed on the surface of the substrate 2. The doses $D_1$-$D_4$ in the respective regions $R_1$-$R_4$ are expresses by the following equations.

$$D_1 = D_A + D_C$$

$$D_2 = D_B + D_C$$

$$D_3 = D_B + D_D$$

$$D_4 = D_A + D_D \qquad \text{Equation 4}$$

The above driving speed may be $v_C = v_A$ and $v_D = v_B$. However, this leads to $D_C = D_A$ and $D_D = D_B$. Therefore, $D_2 = D_4$ so that the implanted regions $R_2$ and $R_4$ provide equal dose amount. In this case, a plurality of implanted regions may be realized. In order to avoid providing the equal dose amount, however, it is only required that at least one of $v_C \neq v_A$ and $v_D \neq v_B$ is realized.

For example, it is assumed that $v_C \neq v_A$. This applies to the following examples.

The driving of the substrate in each of the implanting steps 40 and 42 should not be limited to once the one way. It may be repeated at plural times while the driving speed is changed for each time in order to provide the desired doses. This also applies to the following examples.

Figure 5:
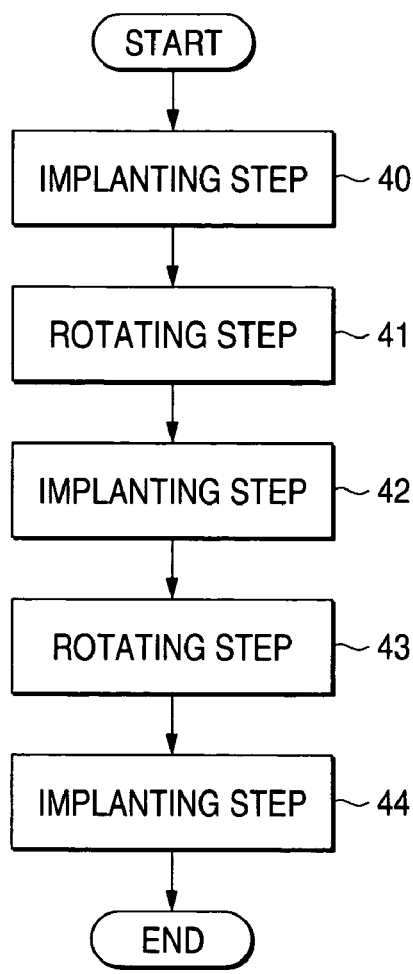
FIG. 5 is a flowchart showing another embodiment of the ion implanting method according to this invention.
Figure 6:
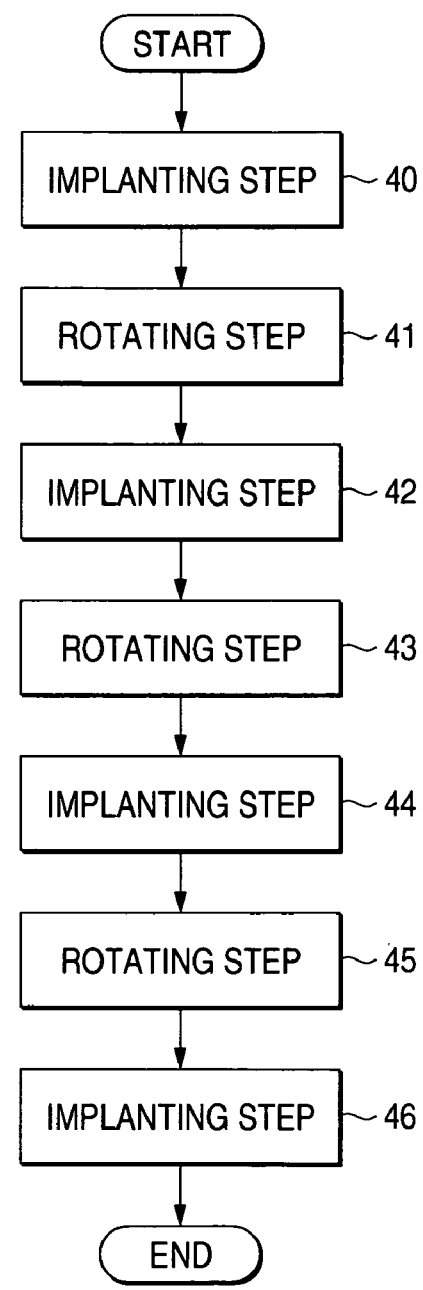
FIG. 6 is a flowchart showing another embodiment of the ion implanting method according to this invention.

FIG. 5 shows a process of the above implanting step at three times (i.e. implanting steps 40, 42 and 44) and the rotating step once during each of the intervals between the respective implanting steps (twice in total, i.e. rotating steps 41 and 43). FIG. 6 shows a process of the above implanting step at four times (i.e. implanting steps 40, 42, 44 and 46). The rotating step is performed once during each of the intervals between the respective implanting steps (three times in total, i.e. rotating steps 41, 43 and 45).

Assuming that total number of times of the ion implanting steps is $n_1$ (integer of 2 or more), relationship between total number of times of rotating steps n and number of the ion-implanted regions N can be expressed by $$n_2 = n_1 - 1 \qquad \text{Equation 5}$$

$$N = 2n_1 \qquad \text{Equation 6}$$

If a rotating angle θ [degree] of the substrate 2 in each rotating step is set to satisfy a following equation, areas of the plural ion-implanted regions to be formed can be made equal to one another.

$$\theta = 360/N \qquad \text{Equation 7}$$

Relationships among the cases of FIGS. 3, 5 and 6 are collectively shown in Table 1.

TABLE 1

| | Number of times of implanting steps $n_1$ | Number of rotating steps $n_2$ | Number of implanted regions N | Rotating angle θ [degree] |
|---|---|---|---|---|
| Example of FIG. 3 | 2 | 1 | 4 | 90 |
| Example of FIG. 5 | 3 | 2 | 6 | 60 |
| Example of FIG. 6 | 4 | 3 | 8 | 45 |

In this embodiment, the above control, i.e. control of the implanting step and the rotating step can be carried out by the control device 36. For this purpose, necessary information is fed to the control device 36.

In this embodiment (ion implantation method and ion implantation apparatus), the driving speed of the substrate 2 is changed at the center 2a of the substrate 2. Unlike the conventional technique, the scanning direction of the ion beam 4 is not inverted within the surface of the substrate and the substrate 2 is not driven and stopped with short steps while the ion beam 4 is applied to the substrate 2. Namely, in this embodiment, the ion beam 4 does not stand still on the substrate 2 so that no excessively implanted region is formed on the surface of the substrate 2.

As regards the transient region of the dose, in FIG. 4, boundaries among the ion-implanted regions have been illustrated as linear segments. However, strictly speaking, transient regions occur among the implanted regions, since the ion beam 4 is applied also while the speed varies instantaneously, even though the driving speed of the substrate as described above has done instantaneously. However, changing the driving speed of the substrate 2 can be generally completed within a time for the ion beam to be scanned by one way. Therefore, assuming that the size of the ion beam 4 in the Y direction is $w_Y$ (see FIG. 7), the width of the transient region is approximately equal to $w_Y$. The driving speed of the substrate 2 can be changed in the Y direction.

Figure 7:
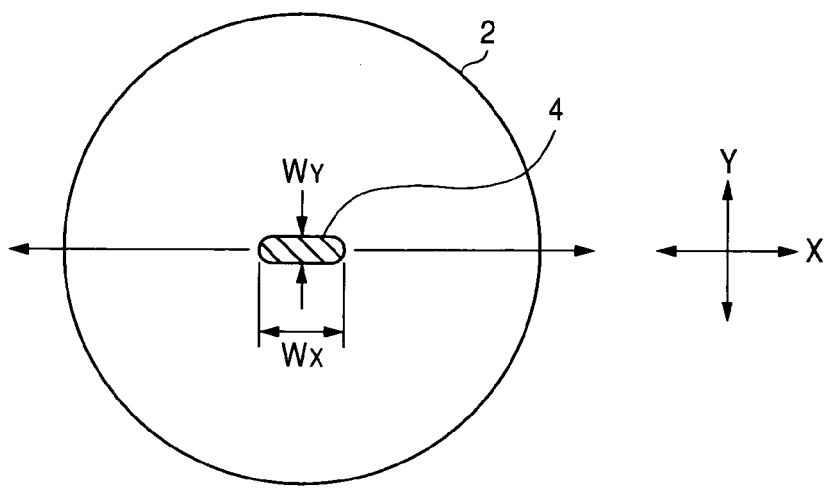
FIG. 7 is a view showing an example of a sectional shape of an ion beam.

For this reason, by decreasing the size $w_Y$ as in the example shown in FIG. 7, the width of the transient region can be decreased.

In the conventional implanting method described before, in order to decrease the width of the transient region, the size of the ion beam 4 must be decreased in both X and Y directions in a two-dimensional scanning. Namely, the sectional area of the ion beam 4 must be decreased in FIG. 7. However, since the current density of the ion beam is limited by space-charge effect, the beam current of the ion beam 4 with a small area is limited to a small magnitude. In the conventional technique, decreasing the width of the transient region decreases the beam current which can not be practically used for processing the substrate 2.

On the other hand, in the embodiment as described above, in order to decrease the width of the transient region, the size w) of the ion beam 4 in the Y direction has only to be decreased. The size $W_X$ of the ion beam 4 in another dimension, i.e. X direction is not required to be decreased, but may be rather increased. For example, as seen from the example of FIG. 7, the sectional shape of the ion beam 4 may be an ellipse of $w_X > w_Y$. For this reason, reduction in the area of the ion beam can be suppressed to prevent the beam current that can be practically used for processing the substrate 2 from decreasing.

Changing the size (sectional shape) of the ion beam 4 as described above can be implemented using the Q lens 16.

In the embodiment, the direction of changing the speed is only one dimension of the Y direction.

Only the driving speed in the Y direction of the substrate 2 has only to be changed so that there is no need changing the direction of the ion beam 4 and driving/stopping of the substrate 2.

Further, the present invention can easily rotate the substrate 2.

Therefore, the above control can also be easily made in the hybrid scan system. The mechanism is not complicated to apply the present invention to the hybrid scan system.

Now referring to FIG. 8, an explanation will be given of an a more concrete embodiment in which four implanted regions S1-S4 with different dose amounts are formed within the surface of a single substrate.

In a first implanting step, a direction B is oriented downward. Regions S1 and S2 are implanted with equal doses, and then regions S3 and S4 are implanted with equal doses. In the rotating step, the substrate 2 is rotated counterclockwise by 90 degree so that the direction B is oriented downward. In the subsequent second implanting step, the implanted regions S2 and S3 are implanted with equal doses, while the implanted regions S1 and S4 are implanted with equal doses.

The driving speed v (t) of the substrate 2 driven by the driving device 32 can be expressed with a proportional constant K of the driving speed. The possible values of K are theoretically a positive integer greater than 0, but may be practically a value in the vicinity of 1. More concretely, for example, the K value will be within a range of 1 ± about several tens %.

$$v_K(t) = v(t)/K \qquad \text{Equation 8}$$

Therefore, the dose D, which is in inverse proportion to the driving speed, is expressed by $$D_K = K \cdot D \qquad \text{Equation 9}$$

The value of the proportion constant K is controlled by the control device 36. Concretely, as described above, by changing the value of the proportion constant K at the center 2a of the substrate 2, the driving speed in the Y direction of the substrate 2 is changed.

Figure 8:
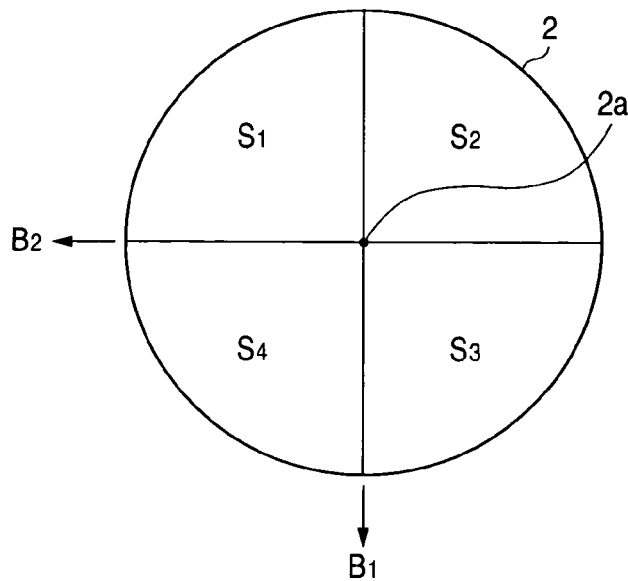
FIG. 8 is a view for explaining a more concrete example when four implanted regions with different dose amounts are formed within the surface of a single substrate.

In the example of FIG. 8, in the first implanting step, assuming that the value of the proportion constant in the lower half of the substrate 2 in the first implanting step (i.e. in the case where the ion beam 4 is applied to the lower half of the substrate 2) is 1 and the value of the proportion constant K in the upper half of the substrate 2 is $\underline{x}$ and also assuming that the dose of the implanted regions S3 and S4 is represented by $\underline{a}$, the dose of the implanted regions S1 and S2 is x·a.

Likewise, in the second implanting step, assuming that the value of the proportion constant K in the lower half of the substrate 2 in the first implanting step (i.e. in the case where the ion beam 4 is applied to the lower half of the substrate 2) is 1 and the value of the proportion constant K in the upper half of the substrate 2 is $\underline{y}$ and also assuming that the dose of the implanted regions S1 and S4 is represented by a, the dose of the implanted regions S1 and S2 is y·a. Incidentally, in the first and the second implanting step, the number of times of driving in the Y direction of the substrate 2 remains constant.

The above results are collectively shown in Table 2.

TABLE 2

|  | Dose in the 1st implanting step | Dose in the 2nd implanting step | Total dose |
|---|---|---|---|
| Implanted Region S1 | x · a | a | (x + 1)a |
| implanted Region S2 | x · a | y · a | (x + y)a |
| Implanted Region S3 | a | y · a | (1 + y)a |
| Implanted Region S4 | a | a | 2a |

Referring the total dose of each of the implanted regions S1 to S4 to αD, βD, γD and D, respectively, following equations hold.

$$(x+1)a = \alpha D$$

$$(x+y)a = \beta D$$

$$(1+y)a = \gamma D$$

$$2a = D \qquad \text{Equation 10}$$

Solving these equations, following equation holds.

$$x = 2\alpha - 1$$

$$y = 2\gamma - 1$$

where $\alpha - \beta + \gamma = 1$

Thus, using the desired doses $\alpha D$, $\beta D$, $\gamma D$ and $D$ of the implanted regions S1 to S4, the more concrete values x and y of the proportion constant K of the driving speed can be represented.

Inversely, the dose of each of the implanted regions S1 to S4 can be controlled, since the driving speed in the Y direction of the substrate 2 is changed by the driving device 32 in accordance with the above values of x and y. It should be noted that the control is limited by $\alpha - \beta + \gamma = 1$.

An explanation will be given of an example on what degree the dose can be controlled using a principle described above.

An example of changing the dose within about 10% at the maximum is offered. Using (x, y)=(1.06, 1.12), ($\alpha$, $\beta$, $\gamma$)=(1.03, 1.09, 1.06). Therefore, four implanted regions with 1.00 times, 1.03 times, 1.06 times and 1.09 times as large as the basic dose can be realized within the single substrate 2.

An example of changing the dose within about 30% at the maximum is offered. Using (x, y)=(1.20, 1.40), ($\alpha$, $\beta$, $\gamma$)=(1.10, 1.30, 1.20). Therefore, four implanted regions with 1.00 times, 1.10 times, 1.20 times and 1.30 times as large as the basic dose can be realized within the single substrate 2.

A further large change can be given. Using (x, y)=(1.80, 2.60), ($\alpha$, $\beta$, $\gamma$) (1.40, 2.20, 1.80). Therefore, four implanted regions with 1.00 times, 1.40 times, 1.80 times and 2.20 times as large as the basic dose can be realized within the single substrate 2.

Next, referring to FIGS. 9 to 11, an explanation will be given of an example of dividing an implanted region by changing a scanning speed of the ion beam 4 in the X direction at the center 2a of the substrate 2.

The ion implanting method and apparatus, scanning apparatus includes the scanning magnet 20 and the scanning power source 22. Scanning output P (t) is supplied to the scanning magnet 20 from the scanning power source 22 (it is a scanning current in the case where the scanner is the scanning magnet 20 as in this embodiment, and a scanning voltage in the case where the scanner is a scanning electrode) A waveform of the scanning output P (t) basically has a triangular waveform with such a constant gradient as indicated by two-dot chain line in FIG. 10A, and so a scanning speed s (t) of the ion beam 4 on the substrate 2 is constant.

Figure 9:
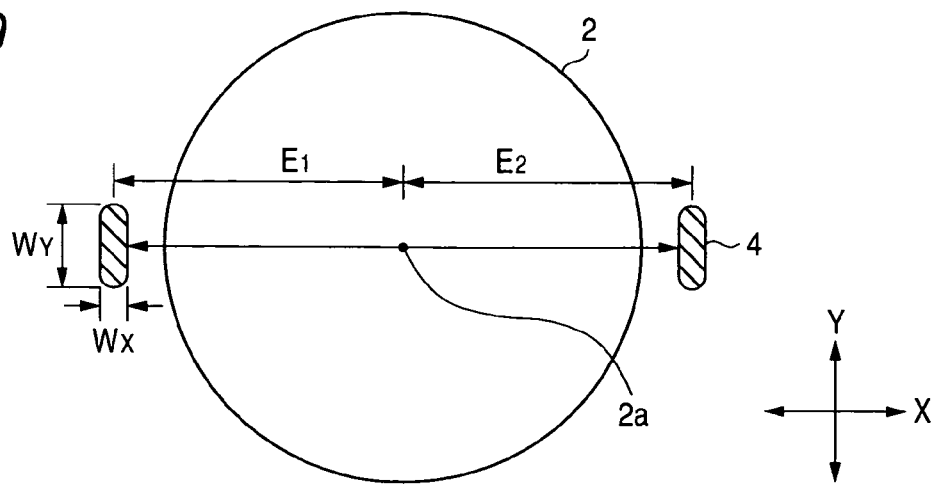
FIG. 9 is a view for explaining an example of an ion implanting method when the scanning speed of the ion beam is changed at the center of the substrate.
Figure 10A:
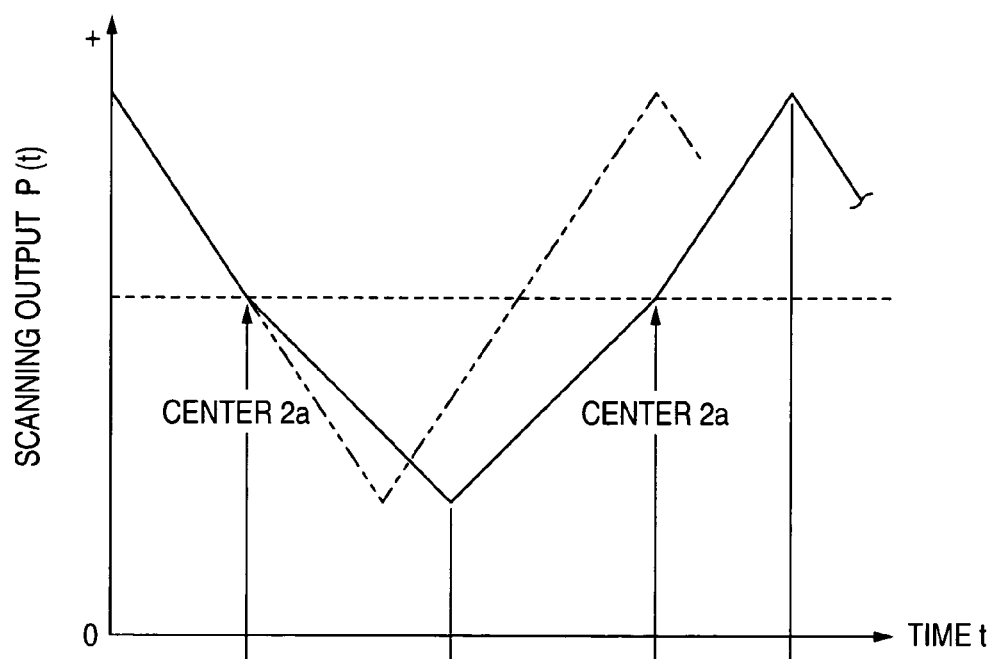
FIG. 10A is graph showing the scanning output P (t) when the scanning speed of the ion beam is changed at the center of the substrate.
Figure 10B:
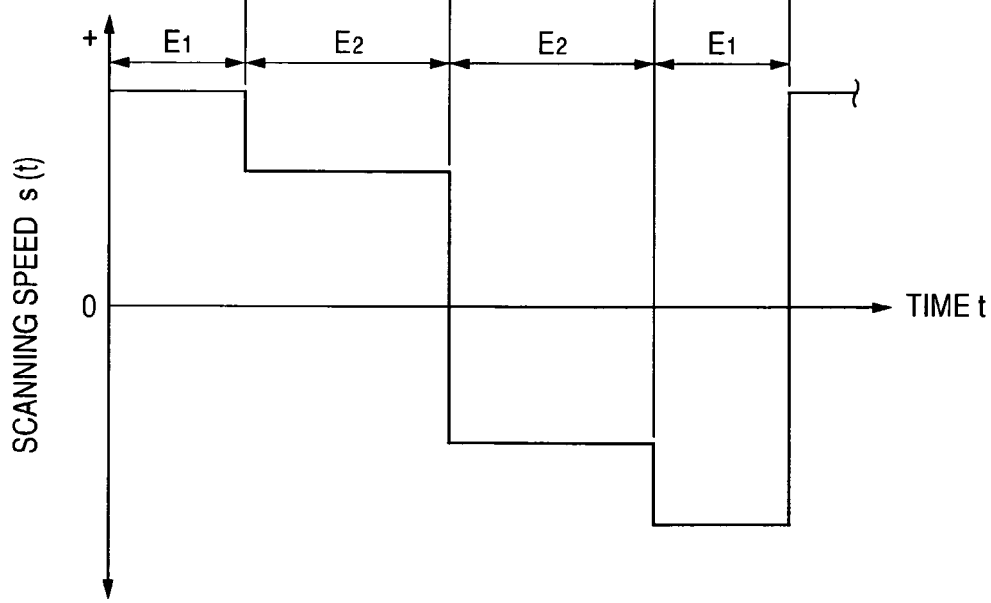
FIG. 10B is graph showing the scanning speed s (t) in an ion implanting method.

On the other hand, in this embodiment, as indicated by a solid line in FIG. 10A, a gradient of the scanning output P (t) is changed at the center 2a of the substrate. In this case, the gradient in the scanning region $E_2$ in the right half in FIG. 9 is made smaller than that in the scanning region $E_1$ in the left half in FIG. 9. As a result, as seen from FIG. 10B, the scanning speed s (t) of the ion beam 4 is smaller in the scanning region E than in the scanning region $E_1$. Therefore, a dose amount is larger in the scanning region $E_2$ than in the scanning region $E_1$. Incidentally, the sign of the scanning speed s (t) is plus where the ion beam 4 is scanned rightward in FIG. 9 whereas it is minus where the ion beam 4 is scanned leftward in FIG. 9.

In this embodiment, instead of making the control of changing the driving speed of the substrate 2 in the Y direction, the control device 36 controls the scanning power source 22 to change a gradient of the scanning output P (t). The scanning power source 22 recognizes that the ion beam 4 has come to the center 2a of the substrate 2. The scanning power source 22 scans the ion beam 4.

On the other hand, the substrate 2 is driven in the Y direction under the control by the control device 36 so that J (t)/v (t) is constant.

Figure 11:
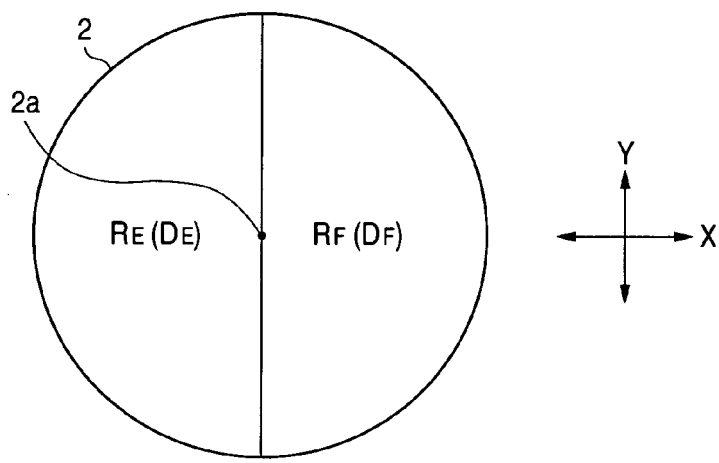
FIG. 11 is a view showing implanted regions formed by the ion implanting method shown in FIG. 10A and FIG. 10B.
Figure 12A:
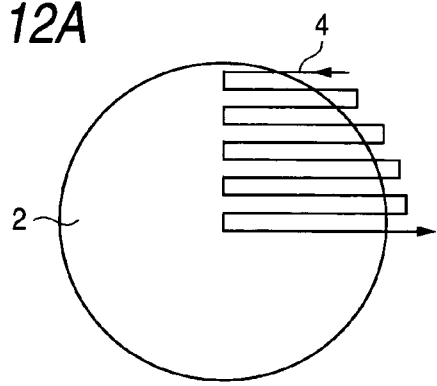
FIGS. 12A to 12D shows processes of an example of a conventional ion implanting method.
Figure 12C:
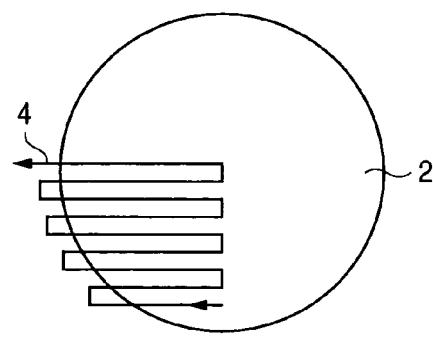
Figure 12B:
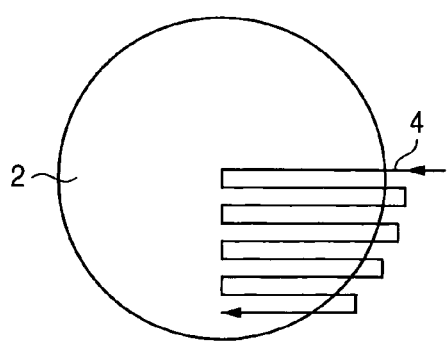
Figure 12D:
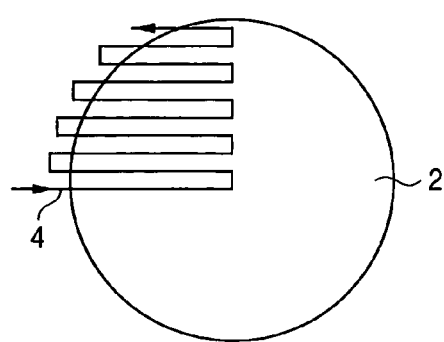
Figure 13:
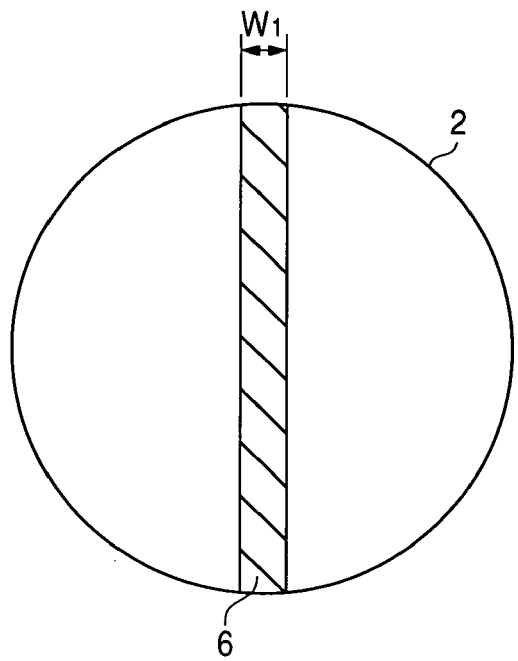
FIG. 13 is a view showing an excessively implanted region which occurs in a conventional ion implanting method.
Figure 14:
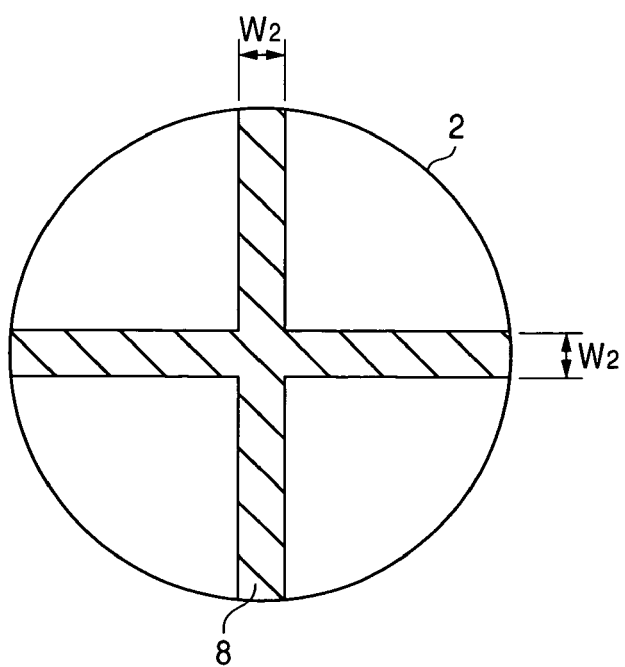
FIG. 14 is a view of a transient region which occurs by the conventional ion implanting method.

By once implementing the implanting step using both ion beam scanning and substrate driving as described above, two implanted regions $R_E$ and $R_F$ with different dose amounts ($D_E < D_F$ in this example) can be formed in the substrate 2 as shown in FIG. 11. Difference between both doses $D_E$ and $D_F$ can be controlled in terms of the different between the gradients of the scanning output P (t).

By implementing such an implanting step at plural times and the step of rotating the substrate 2 once during each of the intervals between the implanting steps described above, as in the case as shown in FIGS. 3 to 6, a plurality of implanted regions with different dose amounts can be formed within the surface of the single substrate. In this case also, Equations 5 to 7 and Table 1 are adopted.

Changing the gradient of the scanning output P (t) at the center 2a of the substrate 2 as described above can be easily realized. For example, it can be easily realized in such a manner that the scanning power source 22 is constructed of a signal generator for generating a signal with any wave form and an amplifier for amplifying the signal to produce the scanning output P (t).

This embodiment (ion implanting method and ion implanting apparatus) also provides the same effect as in the above embodiment.

Namely, in this embodiment, the scanning speed of the ion beam 4 is changed at the center of the substrate 2 unlike the prior art the scanning direction of the ion beam 4 is not inverted on the surface of the substrate 2 so that the ion beam 4 does not stand still on the substrate 2.

Therefore, no excessively implanted region occurs in the surface of the substrate 2.

As regards the transient region of the dose, its 5, width can be decreased by reducing the dimension $w_X$ of the ion beam 4 in the X direction of changing the scanning speed of the ion beam 4 as in the example shown in FIG. 9. Reduction in the beam current can prevent by increasing the dimension $w_Y$ of the ion beam 4.

Further, changing the scanning speed of the ion beam 4 and rotating the substrate 2 as described above can be easily implemented so that the control and mechanism is not made complicated.

The embodiment hitherto described is directed to the hybrid scan system. However, the technology adopted therein can be applied to the ion implanting method and apparatus in the raster scan system in which the ion beam 4 is scanned reciprocatively in both X and Y directions so that the entire surface of the substrate 2 is subjected to the ion implantation.

In this case also, it should be noted that the above rotating apparatus 30 is provided. The above control device 36 controls the rotating device 30 and the scanning device for scanning the ion beam as described above.

In this case, for example, in the implanting step, with the scanning speed in the Y direction of the ion beam 4 being fixed, with reference to FIGS. 9 and 10, the scanning speed in the X direction of the ion beam 4 may be changed at the center 2a of the substrate. Of course, the opposite to this manner may be adopted.

The rotation of the substrate 2 may be implemented while the ion beam 4 is outside the substrate 2. As occasion demands, the scanning of the ion beam 4 may be stopped outside the substrate until the substrate 2 has been rotated by a prescribed angle.

The ion implanting method and ion implanting apparatus in such a raster scan system can provide substantially the same effect as those in the hybrid scan system described above.

Specifically, since the ion implantation is implemented separately for the two implanted regions of the substrate 2 with different dose amounts by the implanting step once performed, in combination with the rotating step, the plurality of implanted regions with different dose amounts can be formed on the surface of the substrate 2.

Further, the scanning speed of the ion beam 4 is only changed at the center 2a of the substrate 2. Unlike the conventional technique, the scanning direction of the ion beam is not inverted on the surface of the substrate 2 so that the ion beam 4 does not stop. For this reason, no excessively implanted region will be formed on the surface of the substrate 2.

The direction of changing the scanning speed of the ion beam 4 is one-dimension, i.e. the X direction or Y direction. Therefore, by decreasing the size of the ion beam 4 in that dimension, the width of the transient region can be reduced while reduction in the beam current is prevented.

Since the direction of changing the scanning speed of the ion beam 4 is one-dimension and the scanning speed is only changed, the control can be easily made. The rotation of the substrate 2 can be implemented. Thus, the above control can be easily made and the mechanism will not be complicated.

As understood from the above description, in accordance with this invention, a plurality of implanted regions with different dose amounts can be formed within the surface of a single substrate. In addition, no excessively implanted region will be produced. The width of the transient region of the dose can be decreased while the reduction in the beam current is prevented. The control can be also easily implemented.

What is claimed is:

1. An apparatus for implanting ions on a surface of a substrate, the apparatus comprising:
    a scanning device for reciprocatively scanning an ion beam in an X direction and a Y direction orthogonal thereto by an electric field or a magnetic field;
    a rotating device for rotating the substrate around a center of the substrate;
    a control device for controlling one of the scanning device and the rotating device;
    wherein the control device changes one of a scanning speed of the ion beam in the X direction and a scanning speed of the ion beam in the Y direction so that ion implantation is performed in order to separate for two implanted regions on the substrate with different dose amounts, the control device controls the rotating device to rotate the substrate around its center by a predetermined angle after the ion implantation while the ion beam is not applied to the substrate, and the control device control to repeat the ion implantation and the rotation.

* * * * *